United States Patent
Constancias

(10) Patent No.: US 7,842,438 B2
(45) Date of Patent: Nov. 30, 2010

(54) EXTREME ULTRAVIOLET PHOTOLITHOGRAPHY MASK, WITH RESONANT BARRIER LAYER

(75) Inventor: Christophe Constancias, Grenoble (FR)

(73) Assignee: Commissariat A l'Energie Atomique (FR)

( * ) Notice: Subject to any disclaimer, the term of this patent is extended or adjusted under 35 U.S.C. 154(b) by 158 days.

(21) Appl. No.: 12/295,952

(22) PCT Filed: Apr. 2, 2007

(86) PCT No.: PCT/EP2007/053143

§ 371 (c)(1),
(2), (4) Date: Jan. 14, 2009

(87) PCT Pub. No.: WO2007/115961

PCT Pub. Date: Oct. 18, 2007

(65) Prior Publication Data

US 2009/0305147 A1   Dec. 10, 2009

(30) Foreign Application Priority Data

Apr. 7, 2006   (FR) .................... 06 03108

(51) Int. Cl.
  *G03F 1/00* (2006.01)
(52) U.S. Cl. ........................................ 430/5

(58) Field of Classification Search ............... 430/5; 378/35; 359/353
See application file for complete search history.

(56) References Cited

U.S. PATENT DOCUMENTS

| 2003/0031937 A1 | 2/2003 | Yan |
| 2005/0084768 A1 | 4/2005 | Han et al. |
| 2005/0122589 A1* | 6/2005 | Bakker ................ 359/591 |

OTHER PUBLICATIONS

Chen H L et al: High Reflectance of Reflective-Type Attenuated-Phase-Shifting Masks for Extreme Ultraviolet Lithography With High Inspection Contrast in Deep Ultraviolet Regimes; J Vac Sci Technol B Microelectron Nanometer Struct; Journal of Vaccum Science and Technology B: Microelectronics and Nanometer Structures Nov./Dec. 2004, vol. 22, No. 6, pp. 3049-3052, XP002408985.
Sang-In et al: "Design and Method of Fabricating Phase Shift Masks for Extreme Ultraviolet Lithography by Partial Etching Into the EUV Multilayer Mirror"; In Proceedings of the SPIE, vol. 5037 (2003).

* cited by examiner

*Primary Examiner*—Stephen Rosasco
(74) *Attorney, Agent, or Firm*—Lowe Hauptman Ham & Berner, LLP

(57) ABSTRACT

The invention relates to extreme ultraviolet photolithography masks that operate in reflection. These masks comprise a lower mirror covering a substrate, and two types of reflecting zones Z1 and Z2 in order to form a phase shift mask. An etch stop layer is interposed between the lower mirror and an upper reflective structure. This layer has a thickness such that it behaves like a reflective resonant cavity surrounded by the upper and lower reflective structures.

16 Claims, 3 Drawing Sheets

EXTREME ULTRAVIOLET PHOTOLITHOGRAPHY MASK, WITH RESONANT BARRIER LAYER

CROSS-REFERENCE TO RELATED APPLICATIONS

The present Application is based on International Application No. PCT/EP2007/053143, filed on Apr. 2, 2007, which in turn corresponds to French Application No. 0603108 filed on Apr. 7, 2006, and priority is hereby claimed under 35 USC §119 based on these applications. Each of these applications are hereby incorporated by reference in their entirety into the present application.

FIELD OF THE INVENTION

The invention relates to photolithography, and notably to photolithography at very short wavelengths. It relates more precisely to the structure of an extreme ultraviolet lithography mask intended for use in reflection.

BACKGROUND OF THE INVENTION

Photolithography is used to produce electronic, optical or mechanical microstructures, or microstructures combining electronic and/or optical and/or mechanical functions. It consists in irradiating, with photon radiation, through a mask that defines the desired pattern, a photosensitive resist or photoresist layer deposited on a planar substrate (for example a silicon wafer). The chemical development that follows the irradiation reveals the desired patterns in the resist. The resist pattern thus etched may serve several purposes, the most common being the etching of an underlying layer (whether insulating or conducting or semiconducting) so as to define a pattern identical to that of the resist in this layer.

It is sought to obtain extremely small and precise patterns and to align etched patterns very precisely in multiple superposed layers. Typically, the critical dimension of the desired patterns is nowadays a fraction of a micron, or even a tenth of a micron and below. The wavelength of the light used in the photolithography operation limits the resolution—the shorter the wavelength, the finer the patterns may be. Ultraviolet photolithography (and wavelengths down to 193 nanometers) allows finer patterns to be produced than with visible light.

It is endeavored at the present time to go well below these wavelengths and to work in extreme ultraviolet (EUV) at wavelengths between 10 and 14 nanometers. The objective is to obtain a very high resolution, despite the fact that the numerical apertures available in EUV are low, and a sufficient depth of field (greater than a few hundred nanometers).

However, at these wavelengths the materials forming the substrate of the mask are not transparent and the photolithography operation must use masks operating in reflection and not in transmission: the extreme ultraviolet light is projected onto the mask at a low angle of incidence (about 5 to 6 degrees); the mask comprises absorbent zones and reflecting zones; in the reflecting zones, the mask reflects the light onto the resist to be exposed, impressing its image thereon. The path of the light between the mask and the resist to be exposed passes via other reflectors, the geometries of which are designed so as to project a reduced image of the mask and not a full-size image. The image reduction makes it possible to etch smaller patterns on the exposed resist than those etched on the mask.

The mask itself is fabricated using a photolithography process followed by etching with a resist mask or a hard mask (for example made of silica, silicon nitride or chromium), this time in transmission and with a longer wavelength, permitted by the fact that the patterns are larger; or else the mask may be fabricated by electron beam lithography.

Typically, a reflection mask of the binary mask type is made up of a planar substrate covered with a continuous reflective structure, in practice a Bragg mirror i.e. a structure consisting of multiple dielectric layers of different refractive indices, the thicknesses of which are calculated according to the indices, the wavelength and the angle of incidence, so that the various partially reflecting interfaces reflect light waves in phase with one another. This mirror is covered with an absorbent layer etched in the desired masking pattern so that the mask comprises reflecting zones (mirrors not covered with absorbent) and absorbent zones (mirrors covered with absorbent). To give an example, for a wavelength of 13.5 nm and an angle of incidence of 6 degrees, theoretically a reflectivity of 74% is achieved with forty silicon layers of 41.5 ångström (1 ångström=0.1 nm) thickness alternating with forty layers of molybdenum of 28 ångström thickness. Experimentally, a difference of 5% to 10% is observed compared to the theoretical reflectivity. The absorbent zones may consist (among others) of chromium deposited on the mirror. For example, a 600 ångström chromium layer placed on the above mirror now reflects only 1% of the incident light.

In practice, the absorbent layer is produced using two layers superposed on the mirror structure, the first being a buffer layer and the second an actual absorbent layer. The buffer layer has etch selectivity properties with respect to the absorbent layer, so that etching of the second layer is stopped on the buffer layer without damaging the mirror; furthermore, it has etch selectivity properties with respect to the mirror structure, so that it can be removed from the surface of the mirror after etching of the absorbent layer.

It has also been proposed to produce the absorbent zones by locally hollowing out the surface of the mirror and filling the opening with an absorbent layer. The shadowing effect is reduced, but the process is very complex. The article "*Design and Method of Fabricating Phase Shift Masks for Extreme Ultraviolet Lithography by Partial Etching into the EUV Multilayer Mirror*" by Sang-In Han et al., in Proceedings of the SPIE, vol. 5037 (2003), describes such a structure.

Structures have also been proposed for what are called "EUV-PSM masks" (PSM standing for "Phase Shift Mask"). Openings are cut out in the mirror so as to locally reduce its thickness by a value such that the light reflected in the zones of reduced thickness are in phase opposition with the light reflected in the zones of nonreduced thickness. This creates, at the boundary, destructive interference equivalent to absorbent zones. If the reflection coefficient R2 in the zones of reduced thickness remains close to the reflection coefficient R1 in the zones of nonreduced thickness, (for example R2 equal to 85% of R1 or more), the term "H-PSM" (Hard Phase Shift Mask) is used. If one of the reflection coefficients is considerably lower than the other, the term "A-PSM" (Attenuated Phase Shift Mask) is used.

There are also what are called "Alt-PSM" masks or alternating phase shift masks in which two close reflecting zones are separated by an absorbent zone, the two successive reflecting zones producing reflections in phase opposition, thereby ensuring that the reflected light intensity systematically passes through zero in an absorbent zone.

In the same way as for the binary masks, it is possible to produce PSM masks using a buffer layer which has etch selectivity properties with respect to the reflecting layers that have to be etched.

In all these prior embodiments, the buffer layer may be troublesome if it remains in the reflecting zones of the mask since it does nothing but reduce the reflectivity.

SUMMARY OF THE INVENTION

The present invention proposes producing a phase shift mask by giving an active optical role to the buffer layer both in terms of choice of reflectivity and in terms of precision of 180° phase shift between zones of the mask and not only a role of facilitating etching.

For this purpose, the invention proposes choosing the thickness of this buffer layer so that this layer, where it is located between two multilayer reflective structures, has a thickness which gives it the properties of a reflecting resonant cavity, while ensuring a 180° phase shift between zones and a desired reflectivities ratio between zones.

According to the invention, an extreme ultraviolet photolithography mask is provided, which operates in reflection and is of the attenuated phase shift type, comprising an etched pattern made up of first reflecting zones and second reflecting zones, the first zones reflecting the light with a phase opposite the phase of the light reflected by the second zones, the mask comprising a substrate uniformly coated with a multilayer lower reflective structure and on top of the lower reflective structure, in the first zones, a stack of an etch stop layer and of a partially reflective upper multilayer structure, the etch stop layer having etch selectivity properties relative to the layers of the upper reflective structure, characterized in that the second reflecting zones comprise the lower multilayer structure coated only with the etch stop layer, and the thickness of the etch stop layer is chosen so that, on the one hand, the superposition of the lower multilayer structure, the etch stop layer and the partially reflective upper structure in the first zones constitutes a Fabry-Pérot resonant cavity having reflectivity that varies as a function of the wavelength and having a high reflectivity at the operating wavelength of the mask and, on the other hand, the phase shift between the first and second reflecting zones is close to 180°, and finally the reflection coefficient of the second zones is considerably lower than that of the first zones.

The expression "etch selectivity properties" is first understood here to mean the fact that the etch stop layer is not or almost not attacked by the etching products that make it possible to etch the partially reflective upper structure. Specifically, it will be seen that during the manufacture, after the uniform deposition of a reflective upper structure, this upper structure is locally attacked in order to remove it from the second zones where it should not be present.

A resonant cavity of the Fabry-Pérot type consists of two mirrors, at least one being partially transparent, which are separated by a certain optical distance in the direction of travel of the light, and a transparent space (i.e. one that is perfectly transparent or weakly absorbent) between the mirrors. The term "optical distance" is understood here to mean the sum of the various individual optical distances in each of the optical media through which the light passes in succession, each of these individual optical distances being the physical distance in the direction of travel of the light multiplied by the refractive index of the medium through which it passes. The cavity is resonant if the light directly reflected on the upper mirror is phase-shifted by a multiple of 180° with respect to the light that leaves the upper mirror after one round trip in the cavity, including a reflection on the lower mirror. If this is an odd multiple of 180°, the cavity is absorbent in the sense that the multiple reflections create destruction interference because they produce rays in mutual phase shift of 180° after round trips in the cavity. If this is an even multiple, the resonant cavity is reflecting, the light emanating from multiple reflections in the cavity generating waves in phase with the principal reflection, and therefore constructive interference. This resonance situation may be obtained with a short distance between mirrors (of around 40 ångströms for wavelengths of around 135 ångströms).

In the description which follows, the word "cavity" is taken in the sense of an "optical" cavity.

The mirrors of the cavity may be multilayer structures of the Bragg mirror type.

Thus, the phase shift mask comprises first zones which are reflecting due to the stack of a reflective lower structure, an etch stop layer and a partially reflective upper structure, with resonance properties of the etch stop layer surrounded by these two structures; and the mask comprises second zones which are also reflecting due to the presence of the lower reflective structure but which are less reflective than the first. So that the mask is indeed a 180° phase shift mask, which is generally the objective to be achieved, it is ensured that the difference in the optical path between the rays reflected by the first zones and the rays reflected by the second zones corresponds to an odd multiple of a half-wavelength.

The amounts of light reflected at the operating wavelength on each of the zones depends on the thicknesses of the various layers, on the angle of incidence θ of the light, on the propagation index of the materials through which the light passes (complex index, n, k where n is the refractive index and k the attenuation coefficient), and of course on the reflection and transmission coefficients of the mirrors of the cavity.

The invention is particularly suitable for producing masks of the attenuated-PSM type in which the difference in the reflection coefficients between adjacent zones is large since the buffer layer can, if it is thick enough, be used to adjust this difference in the reflection coefficients.

The thickness of the etch stop layer is determined as a function of the number of layers of the upper mirror so that the phase shift is indeed 180°. This determination may be carried out by calculation or by experimental nonograms: the phase shift specifically depends on the number of layers of the upper mirror. The number of layers of the upper mirror is preferably between 9 and 20; too low and it may prevent a phase shift of 180° being obtained; too high and it would render the upper layer not transparent enough to allow the formation of a resonant Fabry-Pérot cavity and in particular it would introduce too large a physical step height between adjacent zones, leading to undesirable shadowing effects. The calculation obviously also takes into account the refractive indices and the cosines of the angle of incidence θ of the EUV light in use.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and it several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 1 is a reminder of the principle of a Fabry-Pérot resonant cavity operating in reflective mode, the outgoing radiation from the cavity being on the same side of the cavity as the incoming radiation.

This figure shows a substrate 10 on which a lower mirror 12, assumed to be perfectly reflecting, and then an upper mirror 14, which is partially reflecting and partially transparent, have been deposited, the second mirror being separated from the first by a distance d, and the space 16 between the two mirrors being empty or filled with a transparent or weakly absorbent material of refractive index n.

The incident light rays pass through the upper mirror 14 and the cavity, before passing back through the cavity and the mirror after reflection on the lower mirror 12. The optical path length followed by the rays is then a function of the distance d, the index n and the angle of incidence θ.

The overall reflection coefficient depends on the transmission and reflection coefficients at each interface, namely t1, r1 at the interface between the upper mirror 14 and the external medium, t'1, r'1 at the interface between the mirror 14 and the cavity, and t2, r2 at the interface between the cavity and the lower mirror.

The cavity is resonant and absorbent if the multiple reflections generate destructive interference, that is to say, if the rays reflected after one round trip in the cavity are phase-shifted by 180° (an odd multiple of the half-wavelength) with the rays that are directly reflected without passing through the cavity. The resonance condition in absorption therefore sets a cavity thickness d, this being:

$$d=(2m+1)\lambda/4n \cos\theta$$

where m is an integer, λ is the wavelength and θ is the angle of incidence of the light.

In contrast, the cavity is resonant and reflecting if the multiple reflections generate constructive interference, that is to say, if the rays reflected after one round trip in the cavity are phase-shifted by 360° (an even multiple of a half-wavelength) with the rays that are directly reflected without passing through the cavity. The resonance condition in reflection therefore sets a cavity thickness d, this being:

$$d=2m\lambda/4n \cos\theta.$$

Reflectivity curves as a function of thickness at a given wavelength, or as a function of the operating wavelength for a given thickness, therefore have alternating reflectivity peaks and absorption peaks representing the resonance in reflection and the resonance in absorption respectively.

These resonance condition values are theoretical values, it being possible for the experimental values to be slightly different, without the principle changing, notably as a function of the construction of the mirrors. In particular, the mirrors may be formed by Bragg multilayer structures and the conditions for obtaining resonance must take account of this fact, since it is not possible to consider that the reflection in a multilayer mirror occurs exactly at the surface of the upper layer. To simplify the explanations, it will nevertheless be assumed that the distance between the mirrors is governed by the above formulae for obtaining resonance.

Figure 2:
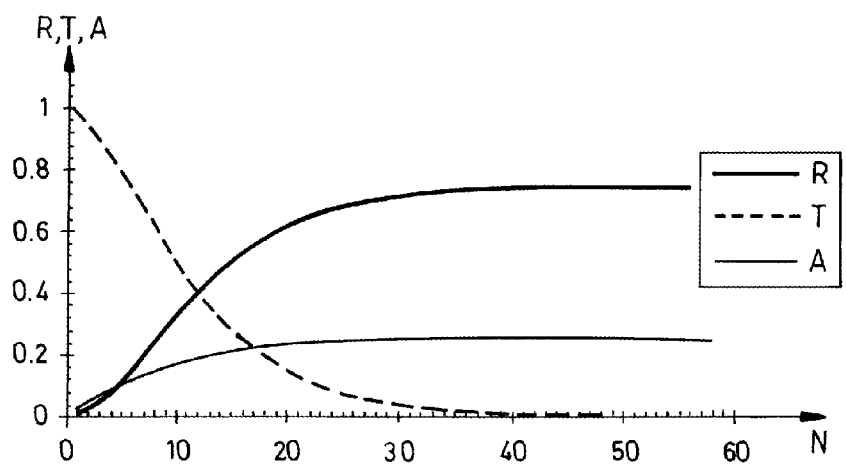
FIG. 2 shows typical reflectance, transparency and absorption curves for a multilayer mirror structure.

The reflectivity and the transparency of the multilayer structures depend on the number of layers. FIG. 2 shows an example of the reflectivity and transparency curves for structures consisting of alternating silicon (41.5 ångström) and molybdenum (28 ångström) layers for a wavelength of 13.5 nanometers (preferred according to the invention) and an angle of incidence of 6°, as a function of the number N of pairs of layers. The reflectivity R, the transparency T and the absorption A are depicted. The figure shows that the reflectivity and the transparency are approximately the same for N=12 pairs of layers; the upper mirror 14 can be produced with twelve pairs of layers if it is desired for this to be 50% reflective.

In what follows, the numerical data will be based on a choice of 13.5 nanometers for the wavelength and 6° for the angle of incidence.

Figure 3:
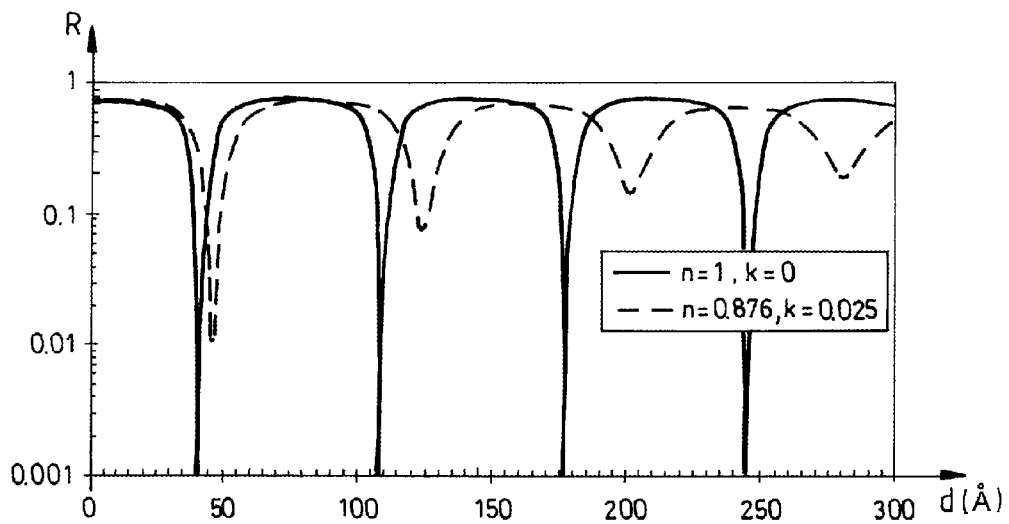
FIG. 3 shows reflectivity curves for a Fabry-Pérot cavity as a function of the distance d separating the two mirrors of the cavity.

FIG. 3 shows the reflectivity R of the overall Fabry-Pérot cavity as a function of the distance d when the cavity is produced with a semitransparent upper mirror consisting of twelve pairs of Si (41.5 ångström)/Mo (28 ångström) layers and with a lower mirror consisting of 30 pairs of layers (of the same thicknesses). These mirrors are Bragg mirrors and the thicknesses of 41.5 and 28 ångströms are thicknesses that correspond to optical phase shifts that are multiples of a half-wavelength, taking into account the different optical indices of the two materials and taking into account the intended angle of incidence (6°), so that the multiple layers act as a mirror, establishing multiple reflections all in phase at the output of the mirror.

FIG. 3 shows two curves:
one, shown by the solid lines, with an empty or air-filled cavity (index 1, attenuation 0); and
the other, shown by the dashed lines, with a cavity assumed to be filled with a weakly absorbent material supposed to have a propagation index n=0.876, k=0.025.

Figure 1:
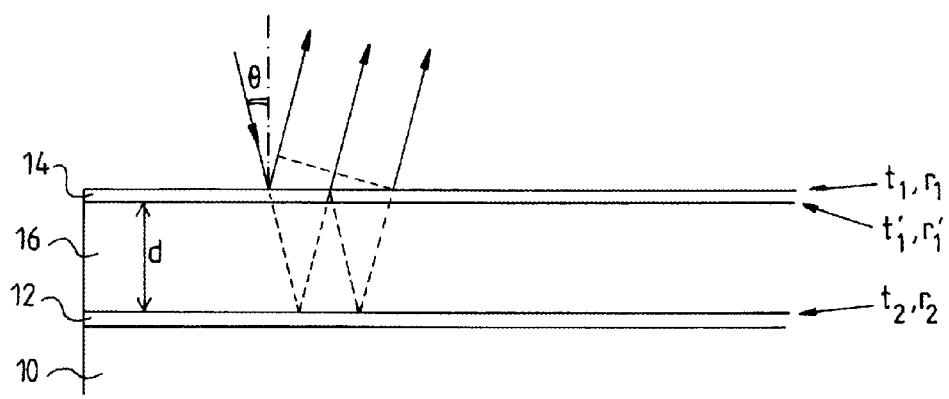
FIG. 1 shows schematically the principle of a Fabry-Pérot resonant cavity operating in reflective mode.

It has been found that the structure shown in FIG. 1 has absorption peaks (very low reflection) for certain values of the distance d and that, on the contrary, the reflectivity is a maximum around the middle of the interval between these peaks. Reflectivity peaks would be observed if the curves were plotted as a function of the wavelength for a given thickness d.

The position of the point of maximum reflectivity depends on the index of the transparent material located between the mirrors.

The reflectivity peaks are relatively flat, which shows that it is possible to vary the thickness of the cavity quite widely while retaining a high reflectivity.

Figure 4:
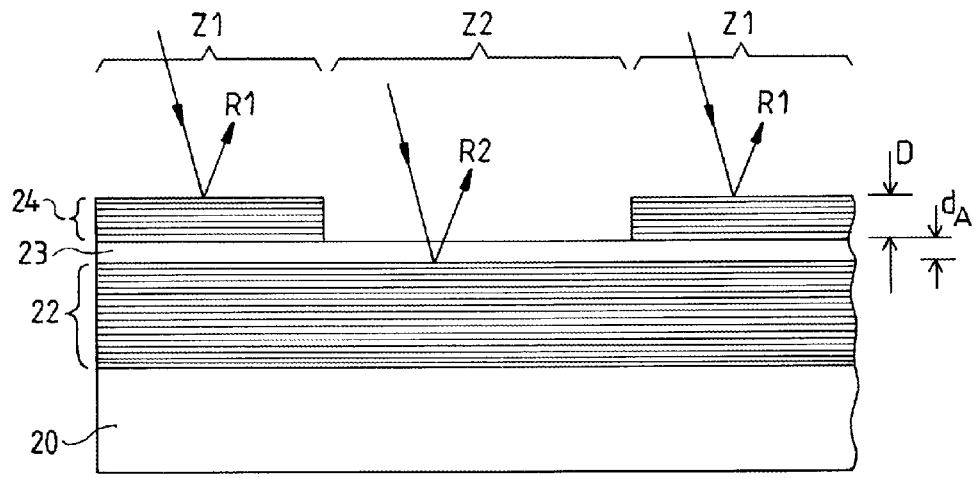
FIG. 4 shows a mask structure according to the invention.

Starting from these observations, an EUV reflection phase shift mask (PSM) is constructed, the embodiment of which is shown schematically in FIG. 4.

The mask is formed on a substrate 20 having a planar surface, and it comprises zones Z1 of a first type and zones Z2 of a second type. The zones Z1 reflect the incident ultraviolet light with a reflection coefficient R1, and the zones Z2 reflect the light with a reflection coefficient R2 and a phase shift that is an odd multiple of 180° relative to the phase of the light reflected by the zones Z1.

The zones Z1 are formed by the stack of a reflective multilayer lower structure 22, an etch stop layer 23, and a partially reflective multilayer upper structure 24. The zones Z2 are formed by the stack of the same reflective lower structure 22 and the same etch stop layer 23, but they do not comprise any upper structure 24 nor another layer on top of the etch stop layer (except possibly one or more protective layers that would cover both the zones Z1 and Z2).

The multilayer lower structure 22 is formed, for example, from at least 30 pairs of alternating layers of silicon (41.5 ångströms thick) and molybdenum (28 ångströms thick). These numerical values are linked to the choice of a preferred operating wavelength of 13.5 nanometers and a preferred angle of incidence in operation of around 6° that are adopted for all the examples given in this description. With another wavelength and another angle of incidence, it would be necessary to choose other values in order to satisfy the Bragg condition and to obtain reflecting mirrors.

Generally, a person skilled in the art will determine the thicknesses of the layers of the stack using Bragg's law.

The upper structure may be formed, for example, from pairs of identical layers, Si (41.5 ångströms)/Mo (28 ångströms) but of a lesser number, for example between 9 and 15 pairs of layers; this lesser number is due to the fact that it is desired to limit the height difference between the upper surface of the zones Z1 and the upper surface of the zones Z2 so as not to create too large a shadowing effect in the presence of illumination under oblique incidence; a lesser number of layers generates a lower reflectivity and this is why the multilayer structure 24 is qualified as partially reflective. The multilayer upper structure is not necessarily formed from layers identical to those of the lower structure.

The reason for the presence of the etch stop layer 23 is due to the manufacturing process: the multilayer upper structure 24 is deposited uniformly over the whole of the substrate 20, on top of the lower structure and the zones Z2 are defined by photolithography and local removal of the upper structure 24 which only remains in the zones Z1. In order to precisely define the number of layers or number of pairs of layers removed in the zones Z2 and to avoid damaging the upper surface of the structure 22 in these zones, the layer 23 is interposed between the two structures 22 and 24. The etch stop layer 23 is not attacked by the etching products of the multilayer structure 24. It is therefore possible to remove the entire thickness of the upper structure 24 without difficulty in the zones Z2 and the lower structure remains completely protected during this etching operation.

It is understood that if the stop layer 23 was not present, the reflection coefficient in the zones Z1 would be very high since it results from the superposition of a high number of pairs of layers, the thicknesses of which satisfy the Bragg resonance condition.

But the presence of the stop layer disturbs this reflectivity, and furthermore it introduces a phase shift between zones which varies nonlinearly with the thickness of the layer.

It is possible to arrange it, notably so that the stop layer 23, chosen to be sufficiently transparent, also more or less satisfies the Bragg condition and establishes an optical phase shift that is a multiple of around 180° for the rays that pass through it, in order that the round trip of the rays through this layer establishes a phase shift that is a multiple of around 360°. This transparent layer, placed between a partially reflecting mirror (structure 24) and a reflecting mirror (structure 22) then forms, at the operating wavelength and for the chosen angle of incidence, a reflecting resonant Fabry-Pérot cavity that has a maximum reflectivity or at the very least a high reflectivity. It will be seen that this is not necessarily located at the peak of the curve of reflectivity as a function of the thickness (or of the wavelength) due to other constraints which, according to the invention, influence the choice of thicknesses of the etch stop layer.

In the zones Z2, the reflectivity is lower, or even much lower for an attenuated-PSM mask; the thickness of the layer 23 remains the same as in the zones Z1 (or almost the same if the fact that the etching of the upper mirror may very slightly attack the etch stop layer is taken into account). The reason why this thickness is retained is the following: industrially, it is desired to minimize the number of manufacturing steps and therefore it is preferred not to introduce a step of removing or a step of adding layers; but it is understood that in that case the constraints which influence the choice of thickness increase since it is desired that this thickness meets not only the condition of high reflectivity in the zones Z1 but also meets a phase shift condition between zones Z1 and Z2 and meets a desired attenuation condition that is greater in zones Z2 than in zones Z1.

Contrary to what has been proposed in the prior art, it has been found, according to the invention, that it was possible to meet these multiple conditions, notably because the conditions of high reflectivity of the Fabry-Pérot cavity in zones Z1 can be satisfied even with a wide range of thicknesses of the etch stop layer.

By choosing a thickness of the etch stop layer that is sufficiently high, it is possible to obtain a much higher attenuation in the zones Z2 than in the zones Z1. But as the Fabry-Pérot conditions are periodic (cf. FIG. 3), it is possible to obtain them even with large thicknesses.

The thickness of the etch stop layer is adjusted to obtain the phase shift condition of 180° between zones Z1 and zones Z2. This may be carried out by nonograms which take into account the entire structure of zones Z1 and Z2. It is observed that in practice it is always possible to find a thickness which, on the one hand, corresponds to a sufficient absorption in zones Z2 (but the reflection coefficient does not need to be precise: it may for example be located between 6 and 10% of the reflection coefficient of zones Z1) and, on the other hand, satisfies the phase shift condition of 180° between the zones Z1 and zones Z2, while remaining in the upper (relatively flat) zone of the reflectivity peaks of the Fabry-Pérot cavity of zones Z1.

In the prior art it would instead be considered necessary to remove the etch stop layer in the zones Z1 (in order to make hard-PSM masks) or to add specifically absorbent layers. According to the invention, it has been found that, despite the triple constraint of the reflectivities, the phase shifts and the attenuation, it was possible to greatly simplify the processes for the industrial manufacture of an attenuated PSM mask by retaining the etch stop layer as is, without removing or adding another layer.

The etch stop layer 23 may be made of silicon oxide; it is known how to selectively etch silicon or molybdenum relative to silicon oxide. Chromium may also be suitable, all the more so because its industrial use is well controlled. Other materials are possible, notably the following: Ru, $ZrO_2$, Ti, TiN, Al, $HfO_2$, Hf, Ta, W, TaN. These materials are cited in the order of the least absorbent to the most absorbent (at the wavelength of 13.5 nanometers), their attenuation coefficient k possibly varying from k=0.01 to k=0.045.

The optical phase shift introduced between the zones Z1 and Z2 is linked to the height D of the multilayer upper structure 24, to the nature of the layers of this structure, to the number of these layers, and to the height $d_A$ and to the index $n_A$ of the stop layer 23.

The calculation of the phase shift between the zones Z1 and Z2 is a complex calculation, generally carried out by specific computer programs such as the free IMD software available on the Internet site http://-www.esrf.fr/computing/scientific/xop/extensions.html.

The bases of the calculations are recalled: the existence of a resonant cavity in zone Z1 introduces a phase change between zones Z1 and Z2 and this variation is nonlinear with the height $D+d_a$ of the stop layer. The complex amplitude $AR_1$ of the wave reflected at the top of the layers in zone Z1 is:

$$AR_1 = [R_1 + (R_1^2 + T_1) \cdot R_2 \exp(j\Phi)] / [1 + R_1 R_2 \cdot \exp(j\Phi)]$$

where $\Phi = (2\pi/\lambda) 2 n_A \cdot d \cdot \cos\theta$ $R_1$ is the overall reflection coefficient of the upper mirror, $R_2$ that of the lower mirror, $T_1$ the transparency of the upper mirror, $n_A$ the index of the buffer layer.

The coefficients of the mirrors are calculated iteratively according to the known Fresnel laws: typically the reflection coefficient of the stack of j layers is calculated from the theoretical reflection coefficient $r_{j,j-1}$ of the interface between the layer j and the layer j−1 immediately below and from the overall reflection coefficient $r_{j-1}$ of the stack of j−1 subjacent layers; it may also involve the phase shift introduced by the $j^{th}$ layer, namely $\Phi_j = (2\pi d n_j \cos\theta)/\lambda$ where $n_j$ is the index of the row j layer.

$$r_j = [r_{j,j-1} + r_{j-1} \exp 2i\Phi_i] / [1 + r_{j,j-1} r_{j-1} \exp 2i\Phi_j]$$

The calculation is very similar for the transmission coefficient $t_j$ of the stack of j layers, which is also carried out by iteration of the transmission coefficients $t_{j,j-1}$ of the interface between the layer j and the layer j−1 and from the overall transmission coefficient $t_{j-1}$ of the stack of j−1 subjacent layers:

$$t_j = [t_{j,j-1} t_{j-1} \exp 2i\Phi_i] / [1 + r_{j,j-1} r_{j-1} \exp 2i\Phi_j]$$

The coefficients $r_{j,j-1}$ and $t_{j,j-1}$ are calculated by the Fresnel equations that define the reflection and transmission between two layers having different indices.

It is understood that these various parameters define several degrees of freedom for the choice of thicknesses of layers that result in a certain reflection coefficient in each of the zones Z1 and Z2 and a certain phase shift between the waves reflected in these two zones.

They take into account for these choices:
the composition of the lower mirror, number of pairs of layers, thickness of the pair, choice of the layers and of their thickness ratios;
same thing for the upper mirror;
number of pairs of layers to be etched in order to obtain a phase shift of 180°;
the material of the stop layer (notably its index $n_A$); and
the thickness $d_A$ of this stop layer.

It is known how to experimentally plot phase shift and reflectivity curves as a function of the thickness of the stop layer for various numbers of pairs of layers of the upper mirror.

In an example of such experimental measurements, carried out with silica as the etch stop layer and with pairs of molybdenum/silicon layers having the thicknesses defined previously, it was found that it was possible to obtain a phase shift of 180° on condition of having at least 9 pairs of Mo/Si layers, but preferably 11 to 17 (beyond that, the thickness of the upper mirror would lead to detrimental shadowing effects for the angle of incidence of 6° envisaged in this example.

Typically, with the numerical values envisaged previously, it is possible to produce a hard-PSM mask with 9 pairs of layers for the upper mirror and a silica thickness of 32 ångströms or 100 ångströms as the etch stop layer. The phase shift is 180° and the ratio of reflectivity between the zones Z2 and the zones Z1 on which the silica layer remains. When the number of pairs of layers for the upper mirror is 11, the silica thickness is 20 ångströms in order to obtain a phase shift of 180°. The ratio of reflectivities is greater than 90%.

If now the etch stop layer is removed in zone Z2, it is possible to have 11 pairs of layers on the upper mirror and a thickness of 90 ångströms for each silica stop layer; the ratio of reflectivities remains close to 1:around 85%.

But it is also possible to obtain, due to the presence of the resonant Fabry-Pérot cavity formed from the silica layer between the two mirrors, a much lower ratio of reflectivities, of around 10% for example or 6%, while retaining the stop layer in the zones Z2 and by using it as an absorbent layer, still with a thickness calculation that gives a phase shift of 180° between zones Z1 and Z2.

Once the material of the stop layer is chosen, both the number of pairs of molybdenum and silicon layers forming the upper mirror 24 in the zones Z1 and the thickness of the etch stop layer are set. The phase shift varies as a function of this thickness for a given number of pairs. This variation has a sawtooth profile and a phase shift of 180° may be obtained for a discrete series of thicknesses, for a given number of pairs.

The ratio of reflectivities between zones Z1 and Z2 also varies a lot depending on the thickness of the etch stop layer.

It is possible to plot, by simulation, curves of the variation in the ratio of reflectivities and in the phase shift, each time as a function of the thickness of the stop layer and of the number of pairs of layers of the mirror. And, starting from this, it is possible to find stop layer thickness/number of pairs of the mirror relationships which give the desired result, mainly simultaneously a phase shift of 180°, a good reflectivity of the zone Z2 and a desired ratio of reflectivities between zones Z2 and Z1 (typically 6 to 10%).

Although there are several choices possible for the numbers of pairs of layers of zone Z1, the smallest number of pairs is taken in order to minimize the shadowing effects.

Figure 7:
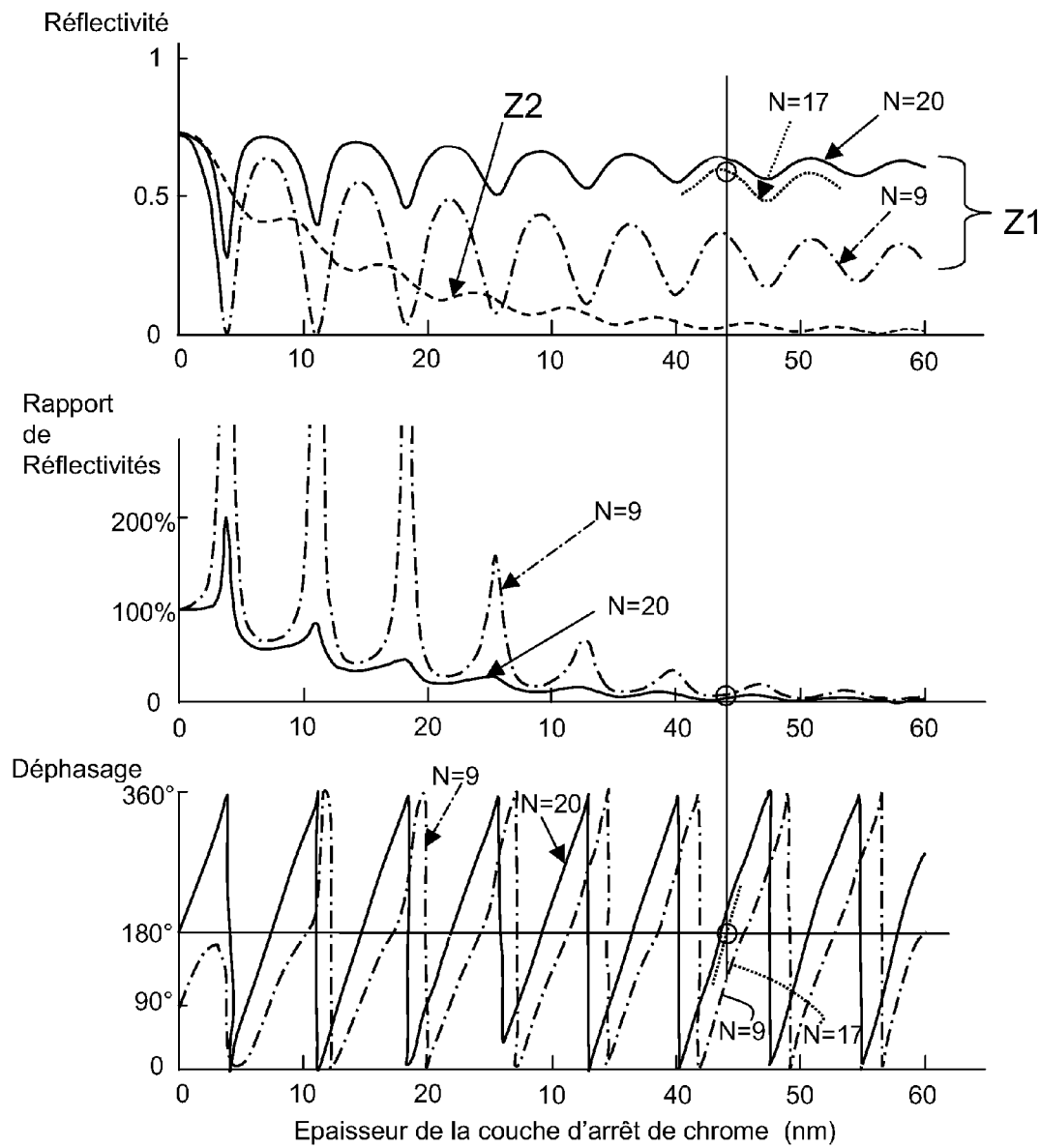
FIG. 7 shows a set of curves obtained by simulation that give the reflectivity, the reflectivity ratio and the phase shift as a function of the thickness of the etch stop layer, by varying the number of pairs of layers of the upper mirror.

In FIG. 7, a set of curves obtained by simulation is given by way of example in order to make it understood how it is possible to choose the desired obtention conditions. All the curves are plotted as a function of the thickness of the etch stop layer, in nanometers. The layer is made of chromium.

The curves from the upper part are reflectivity curves. The curve with the simple dashed line is the curve for the reflectivity of zone Z2, decreasing overall due to the absorption coefficient of the chromium. The curve with the solid line is the curve for the reflectivity of zone Z1 when there are N=20 pairs of molybdenum and silicon layers in the upper mirror. The curve with the mixed (dashes and dots) line is the curve for the reflectivity of zone Z1 when there are N=9 pairs of layers in the upper mirror.

Between the curves representing the reflectivity of zone Z1, the curves for numbers of pairs of layers between 9 and 20 have not been represented in order to retain sufficient readability of the diagram. However, a small portion of the curve corresponding to N=17 pairs of layers in the upper mirror has been represented as a closely spaced dotted line.

The curves from the central part of FIG. 7 are taken from the curves of the upper part and represent the ratios of reflectivity between zone Z1 and zone Z2, as a function of the thickness of the etch stop layer and for each number N of pairs of layers of the upper mirror. Only the curves for N=9 (mixed dotted-dashed line) and for N=20 (solid line) are represented. The curves for other values of N are intermediate.

The curves for the lower part of FIG. 7 represent the phase shift between zones Z1 and zones Z2. The phase shift is represented as modulo 360° and it therefore varies as a sawtooth profile and depends on the number N of pairs of layers. The curves are represented for N=9 (mixed line), for N=20 (solid line), and a small portion is represented (dotted line) for N=17.

By observing these layers it is noticed that it is possible to find a choice of thickness and of number of pairs of layers which supplies a phase shift of 180°, a high reflectivity of zone Z2 (greater than 60%) and a desired reflectivity ratio between zone Z1 and zone Z2. Represented in FIG. 7 by way of example is a desired operating point for a reflectivity ratio of around 6 to 10%. This point is found for N=17 pairs of layers and for a thickness of the chromium stop layer of around 44 nanometers.

Although several points are possible, that which minimizes the number of pairs of layers of the upper mirror will be chosen.

The invention is particularly advantageous for producing attenuated phase shift masks.

Figure 5:
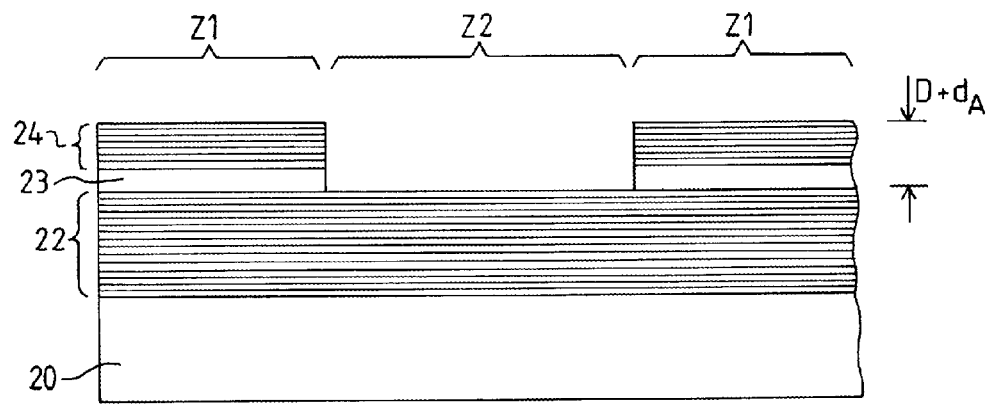
FIG. 5 shows an unattenuated mask structure.
Figure 6:
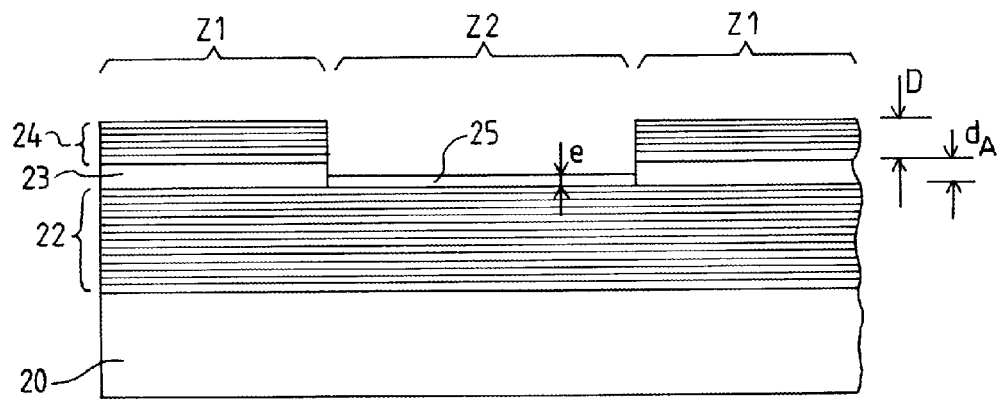
FIG. 6 shows a mask structure with a phase adjustment layer.

The industrial production is easier than if, as in the case of FIG. 6, a specific phase adjustment layer was used. In the case of FIG. 6, first the layer 23 is removed in zones Z2 as in FIG. 5, then an additional layer of transparent material 25 is deposited on zones Z2. The layer 25 may be made of material (for example silicon oxide) identical to the layer 23, but it does not have the same thickness $d_A$. This layer 25 has a controlled thickness e which is used to finely adjust the phase shift of 180° introduced by the step difference between the upper surface of zones Z1 and the upper surface of zones Z2. It would theoretically be possible to adjust the phase shift by removing only one part of the thickness of the stop layer 23, in an embodiment which would be intermediate between those of FIGS. 5 and 6; however, the control of the thicknesses removed by chemical attack is not very precise and it is preferred to remove the whole of the stop layer 23 in zones Z2 and to again deposit a controlled thickness of a transparent material, as the control of the thickness in a deposition phase is much more precise than the control of the thickness in a material removal phase.

The thickness e added so that the phase shift between zones Z1 and Z2 is as close as possible to 180° (or an odd multiple of 180°) may be calculated as a function of the following parameters: the angle of incidence θ, the optical (ultraviolet) index of layer 25, the height D of the structure 22 removed, and the height $d_A$ of the stop layer removed.

The choice of the thickness added depends on the refractive index $n_B$ of the layer 25.

It is therefore possible to finely choose the thickness e which produces a phase shift of 180° or an odd multiple of 180°.

It would also be possible to envisage a phase shift adjustment layer made of a transparent material such as silicon (in the case of a hard-PSM mask).

In order to deposit the adjustment layer 25, it is possible to use a process known as a lift-off process: deposition of a resist, photo etching to remove it in zones Z2, deposition of the adjustment layer 25, and removal of the resist with the layer which covers it, only the zones free of resist retaining the adjustment layer.

It would also be possible to deposit a phase adjustment layer on the etch stop layer without removing it.

As can be seen, this solution from FIG. 6 is in any case more complex than that from FIG. 4, which consists in purely and simply retaining the etch stop layer, the thickness of which will have been chosen from the start to take into account the three constraints of reflectivity of the zones Z1, reflectivity ratio between zones Z1 and Z2 and a phase shift of 180° between zones Z1 and zones Z2.

The invention can be applied to attenuated PSM masks and to alternating PSM masks.

It will be readily seen by one of ordinary skill in the art the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only definition contained in the appended claims and equivalents thereof.

The invention claimed is:

1. An extreme ultraviolet photolithography mask, operating in reflection and of the attenuated phase shift type, comprising an etched pattern made up of first reflecting zones and second reflecting zones, the first zones reflecting the light with a phase opposite the phase of the light reflected by the second zones, the mask comprising a substrate uniformly coated with a multilayer lower reflective structure and on top of the lower reflective structure, in the first zones, a stack of an etch stop layer and of a partially reflective upper multilayer structure, the etch stop layer having etch selectivity properties relative to the layers of the upper reflective structure, wherein the second reflecting zones comprise the lower multilayer structure coated only with the etch stop layer, and the thickness (d) of the etch stop layer is chosen so that, on the one hand, the superposition of the lower multilayer structure, the etch stop layer and the partially reflective upper structure in the first zones (Z1) constitutes a Fabry-Pérot resonant cavity having reflectivity that varies as a function of the wavelength and having a high reflectivity at the operating wavelength of the mask and, on the other hand, the phase shift between the first and second reflecting zones is close to 180°, and finally the reflection coefficient of the second zones is considerably lower than that of the first zones.

2. The mask as claimed in claim 1, wherein the reflectivity of the first zones is greater than 60%, and the ratio of reflectivities between the second zones and the first is around 6 to 10%.

3. The mask as claimed in claim 2, wherein the etch stop layer is made of chromium.

4. The mask as claimed in claim 3, wherein its operating wavelength is 13.5 nanometers.

5. The mask as claimed in claim 2, wherein the etch stop layer is made of silicon oxide.

6. The mask as claimed in claim 5, wherein its operating wavelength is 13.5 nanometers.

7. The mask as claimed in claim 2, wherein the etch stop layer is chosen from the following materials: Ru, $ZrO_2$, Ti, TiN, Al, $HfO_2$, Hf, Ta, W, TaN.

8. The mask as claimed in claim 7, wherein its operating wavelength is 13.5 nanometers.

9. The mask as claimed in claim 2, wherein its operating wavelength is 13.5 nanometers.

10. The mask as claimed in claim 1, wherein the etch stop layer is made of chromium.

11. The mask as claimed in claim 10, wherein its operating wavelength is 13.5 nanometers.

12. The mask as claimed in claim 1, wherein the etch stop layer is made of silicon oxide.

13. The mask as claimed in claim 12, wherein its operating wavelength is 13.5 nanometers.

14. The mask as claimed in claim 1, wherein the etch stop layer is chosen from the following materials: Ru, $ZrO_2$, Ti, TiN, Al, $HfO_2$, Hf, Ta, W, TaN.

15. The mask as claimed in claim 14, wherein its operating wavelength is 13.5 nanometers.

16. The mask as claimed in claim 1, wherein its operating wavelength is 13.5 nanometers.

* * * * *